United States Patent [19]

Lampe et al.

[11] 4,064,533

[45] Dec. 20, 1977

[54] CCD FOCAL PLANE PROCESSOR FOR MOVING TARGET IMAGING

[75] Inventors: Donald Ross Lampe, Ellicott City; Marvin Hart White, Laurel, both of Md.

[73] Assignee: Westinghouse Electric Corporation, Pittsburgh, Pa.

[21] Appl. No.: 625,702

[22] Filed: Oct. 24, 1975

[51] Int. Cl.² .................... H04N 7/18; H04N 5/33; H01L 31/119, H01L/29/78
[52] U.S. Cl. .................................. 358/105; 358/113; 357/24; 250/332; 307/221 D
[58] Field of Search ............... 178/DIG. 33, DIG. 38, 178/7.1; 357/24, 30; 250/578, 332, 370; 358/105, 113, 213; 307/221 D, 221 C

[56] References Cited

U.S. PATENT DOCUMENTS

| | | | |
|---|---|---|---|
| 3,851,096 | 11/1974 | Collins et al. | 178/DIG. 33 X |
| 3,883,437 | 5/1975 | Nummedal et al. | 357/24 |
| 3,886,359 | 5/1975 | Cheek, Jr. et al | 307/221 D |
| 3,931,463 | 1/1976 | Levine | 178/7.1 |
| 3,942,022 | 3/1976 | Stumpf et al. | 178/DIG. 33 |

OTHER PUBLICATIONS

A Simple Motion Detector for Television Signals, Jan. 1973, Journal of the SMPTE, vol. 82, pp. 17-20.

*Primary Examiner*—John C. Martin
*Assistant Examiner*—Aristotelis M. Psitos
*Attorney, Agent, or Firm*—H. W. Patterson

[57] ABSTRACT

A CCD focal plane processor having a plurality of columns of individual sensor elements with plural sensor elements per column. The structure includes plural CCD shift registers corresponding to the number of columns of sensors, each CCD shift register including a pair of stages corresponding to each of the element sensors of the corresponding column of the array. Two "snapshots" of the scene are taken at time-displaced intervals and are compared to detect differences therebetween to eliminate background, or unchanging scene content. The individual sensors provide outputs which are injected into the $\alpha$ stages of the corresponding paired shift register stages of each CCD shift register in a first time interval corresponding to the first "snapshot". The resulting charge packets in the first ($\alpha$) stages then are advanced to the second ($\beta$) stages of each shift register pair. The second "snapshot" corresponds to injecting a second signal into the $\alpha$ stages of the plurality of pairs of $\alpha$, $\beta$ stages. The CCD shift registers then are read out simultaneously and in succession as to the plural, related $\alpha$, $\beta$ pairs of stages containing the time-displaced elemental signal samples. A further CCD shift register including a number of $\alpha$, $\beta$ pairs of stages receives the parallel $\alpha$, $\beta$ outputs in corresponding time sequential manner to maintain the $\alpha$, $\beta$ related pair arrangement of the time-displaced elemental samples. An output circuit compares the $\alpha$, $\beta$ signals for each elemental area and determines the difference therebetween. A CRT display receives the difference signal outputs for displaying moving target information.

10 Claims, 15 Drawing Figures

CCD FOCAL PLANE PROCESSOR FOR MOVING TARGET IMAGING

BACKGROUND OF THE INVENTION

1. Field of the Invention

This invention relates to a focal plane processor for moving target imaging and, more particularly, to such a processor implemented with CTD technology.

2. State of the prior Art

MTI generally implies taking two "snap shots" of a scene and then subtracting one from the other so that all stationary background matter is cancelled, leaving only those scene items which changed between snapshots. Viewed in relation to practical implementations, each snapshot is divided into elemental areas and each elemental area of a first snapshot is compared with an elemental area of the second.

Automatic implementation of an MTI system requires complex circuitry, if for no other reason than the large number of signal samples corresponding to the picture elements of the two "snapshots" which must be processed for detecting differences therebetween and thus to provide an output indicative of moving targets in the scene to which the two "snapshots" correspond.

In the prior art, digital signal processing (DSP) has been utilized in many applications in view of the low cost of the integrated circuits that are available to perform many functions in digital fashion. As compared with analog techniques, DSP has been preferred in that its use of digital implementation has been considered to be preferable in view of cost, weight, flexibility and accuracy considerations. By contrast, the only present advantage of analog techniques is its lower power consumption, which advantage may gradually disappear as technology advances. A further technique known as discrete analog signal processing (DASP) provides an alternative to the aforementioned methods of signal processing and is implemented by sampling at regular intervals an analog signal to provide a series of analog signals or samples, each of which may be operated upon one-at-a-time and have an amplitude containing information on data corresponding to M digital bits, where one bit of resolution in DSP is equivalent to 6dB dynamic range in the analog signal. Experiments have shown that a signal-charge analog packet can be shifted through a typical CTD nearly unattenuated, limited by the size of the holding wells and the minimum detectable output signal.

As more fully described in an article entitled, "Charge Coupled Semiconductor Devices" appearing in *Bell System Technical Journal*, April 1970 by W. S. Boyle and G. E. Smith, CCD'S sample an analog input signal to provide a series of analog bits to be stored in potential wells created at the surface of a semiconductor and transported along the surface by timing or signals. More particularly, these charges constitute minority carriers stored at the silicon-silicon dioxide interface of MNOS non-memory capacitors and are transferred from capacitor or well to capacitor or well on the same substrate by manipulating the voltages applied across the capacitor.

The present invention relates to the use of such CCD technology for the implementation of a moving target imaging system. Certain special CCD techniques are useful in the implementation of the system of the present invention and, accordingly, are noted briefly at this juncture.

U.S. Pat. No. 3,781,574 — White et al, assigned to the common assignee, discloses a coherent sampled readout circuit and signal processor. In one embodiment disclosed in the patent, this circuit and processor are coupled to a CCD shift register. In fact, the circuit and processor of the patent have applicability to any type of device from which an analog charge readout is to be obtained, for purposes of minimizing the degradation of the readout signal and minimizing any noise contribution due to the readout operation. The term coherent sampling as employed in that patent corresponds to a term employed herein of "correlated double sampling" (CDS). The technique of the U.S. Pat. No. 3,781,574 relates principally to output operations and hence may be applied to any system producing an analog charge output such as diode arrays, and CTD, including CCD, systems.

The present invention, moreover, relates to a technique termed "Extended Correlated Double Sampling" (ECDS) which is a form of error correction for cancelling voltage drift and bias errors occurring both at the input and output and within a charge transfer device itself, i.e., as structured between its input and output circuitry.

An early suggestion for achieving cancellation of bias errors and drift consistent with the techniques of extended correlated double sampling is provided in an article entitled, "An Electrically Programmable LSI Transversal Filter for Discrete Analog Signal Processing" (DASP) by Lampe et al, published in Proceedings, CCD Applications Conference 18–20, September 1973, San Diego, California.

United States Patent Application Ser. No. 507,115, filed Sept. 17, 1974, entitled A PROGRAMMABLE ANALOG TRANSVERSAL FILTER, of Lampe et al and assigned to the common assignee hereof discloses in somewhat greater detail, both as to theory and implementation, a system perforing extended correlated double sampling (ECDS). It will be understood that ECDS provides for correction of voltage drift and bias errors, and therein including such sources of error as threshold nonuniformities across device arrays. Threshold non-uniformities and leakage current non-uniformities, of course, have effects similar to a bias error and, in effect, the output signal errors are indistinguishable as between originating from bias errors or threshold and leakage current non-uniformities.

ECDS techniques are more fully disclosed and developed in the application of Lampe et al filed concurrently herewith, Ser. No. 625,694, entitled EXTENDED CORRELATED DOUBLE SAMPLING FOR CHARGE TRANSFER DEVICES, and assigned to the common assignee hereof, that last referenced application being a continuation-in-part of the above referenced application Ser. No. 507,115 of Lampe et al.

SUMMARY OF THE INVENTION

The present invention utilizes techniques of ECDS in a unique manner to provide, effectively, an analog memory and signal processing combined capability. The invention is most readily appreciated with reference to the moving target imaging (MTI) system specifically disclosed herein. As abovenoted, MTI may be visualized as taking two time-displaced or sequential snapshots of a scene and then comparing and, more specifically, differencing the signal levels of corresponding elemental areas of the two snapshots to produce an output representative of the difference. The composite of the differenced output signals then affords an image of moving objects within the scene — stationary objects having no change between the two sequential snapshots being cancelled out in the process. Hence, moving objects in the scene are detected for display, whereas stationary objects, i.e., background, is cancelled and does not appear in the final display.

The present invention is directed to the use of CCD technology in such MTI processing and particularly provides a unique and simple capability of performing on-chip cancellation of the steady background signals from the two "snapshots" and specifically from the corresponding elements of the two snapshots for all such elements and hence performs the frame-to-frame subtraction necessary for MTI purposes. The final output then may be considered as comparable to that of a mosaic "STARER" or a frame-to-frame cancellation MTI system. Moreover, the invention provides correction, or compensation for CCD threshold and leakage non-uniformities and, specifically, in an MTI application, cancellation of CCD threshold non-uniformities and substantial reduction of leakage non-uniformities.

In general, the present invention provides for processing the elemental signals representing, respectively, corresponding elemental areas of the two "snapshots" as a pair of charge packets, and specifically, propagating the two related charge packets as a pair down the CCD channel. An output circuit compares the signals of the related pair and determines the difference therebetween. The resulting difference output signals then, for all of the signal pairs and thus corresponding to all of the elemental areas of the two "snapshots," provide a display of the moving target contained within the scene, with all background, i.e., stationary objects of the scene, cancelled.

A sensor array having plural columns of sensors and corresponding plural CCD shift registers (hereinafter termed CCD column shift registers) may be implemented in a monolithic structure. Each CCD column shift register includes twice as many stages as there are sensor outputs, the stages being related in pairs. Each column shift register includes an injection circuit for injecting a given sensor output into the first pair of a pair of stages corresponding to each such sensor output. The sensor output for each element of the first snapshot, accordingly, is injected into the first of a related pair of stages. A predetermined time duration thereafter, the first injected charge is advanced to the second shift register stage of the pair. Thereafter, the sensor output for the corresponding element of the second snapshot then is injected into the same first stage. Accordingly, the two charge packets for the two time displaced picture elements are injected as a related pair into the two adjacent pair-related stages of the shift register and then are propagated down the shift register, with that relationship maintained.

The outputs of the plural column shift registers conveniently may be injected into yet a further, multiplexing CCD shift register channel, the latter again having related pairs of stages, with each such related pair of stages of the multiplexing CCD shift register corresponding to one of the plurality of column shift registers. The first and second picture element signals, related as a pair, from each of the plural column shift registers are injected, in succession into corresponding adjacent stages of the multiplexing output CCD shift register.

Specifically, the CCD multiplexing shift register includes twice as many stages as there are column shift registers. A charge injector is associated with the first of each pair-related stages. The first of the pair-related, time displaced picture element signals from each of the column shift registers is injected in a first time interval into the first stage of a corresponding stage-pair of the multiplexing CCD shift register, and then is advanced to the second stage of the pair. The second picture element signal of the pair from the column shift registers then is injected into the first stage. This operation occurs simultaneously for all the column shift registers, as to the corresponding pairs of signals.

The multiplexing shift register thus contains paired, time-displaced picture element signals for a first row of picture elements. The multiplexing shift register then is read out at a rate corresponding to, e.g., the rate of a horizontal line scan of a CRT display. In readout of the multiplexing shift register, an output analog reconstruction circuit compares the time-displaced picture element signals of each pair and takes the difference therebetween to output a signal for each picture element. A difference output having some finite minimum value indicates the presence of a moving object (as to that picture element); a difference output having effectively a zero value represents that only stationary or background information was present at that picture element.

The successive pairs of picture element signals associated as corresponding, successive rows are read out successively in a row-by-row manner, each pair thereof is differenced, and supplied to the CRT display circuit in time coordination with the horizontal scan in each of the successive vertically displaced scan lines, thereby generating a display of the moving target imaging information for the entire scene. A system providing such an output is known in the art as a "starer" mode of operation, or "focal plane moving target imaging."

As will be later explained in greater detail, there results from the injection process of the two time-displaced sensor signals for a given picture element, a different residence time of the corresponding injected charge packets within the CCD. To the extent of this time differential, the two charge packets are not subjected to the same conditions of leakage current non-uniformities as the packet pair propagates down the CCD channel. However, the charge packets are subjected to the same threshold non-uniformities.

It will be appreciated that a substantial portion of errors due to these non-uniformities are corrected by the technique of moving target imaging of the present invention. Particularly, and with the exception of the inequality of residence time as affects leakage current non-uniformities, the two charge packets (i.e., the two time-displaced signals) are subjected to substantially similar errors arising out of the non-uniformities of thresholds and leakage current during propagation through the CCD. Hence, these errors are effectively removed in the differencing operation for deriving the MTI outputs. Hence, techniques of ECDS are achieved in the present system.

DETAILED DESCRIPTION OF THE PREFERRED EMBODIMENTS

Figure 1:
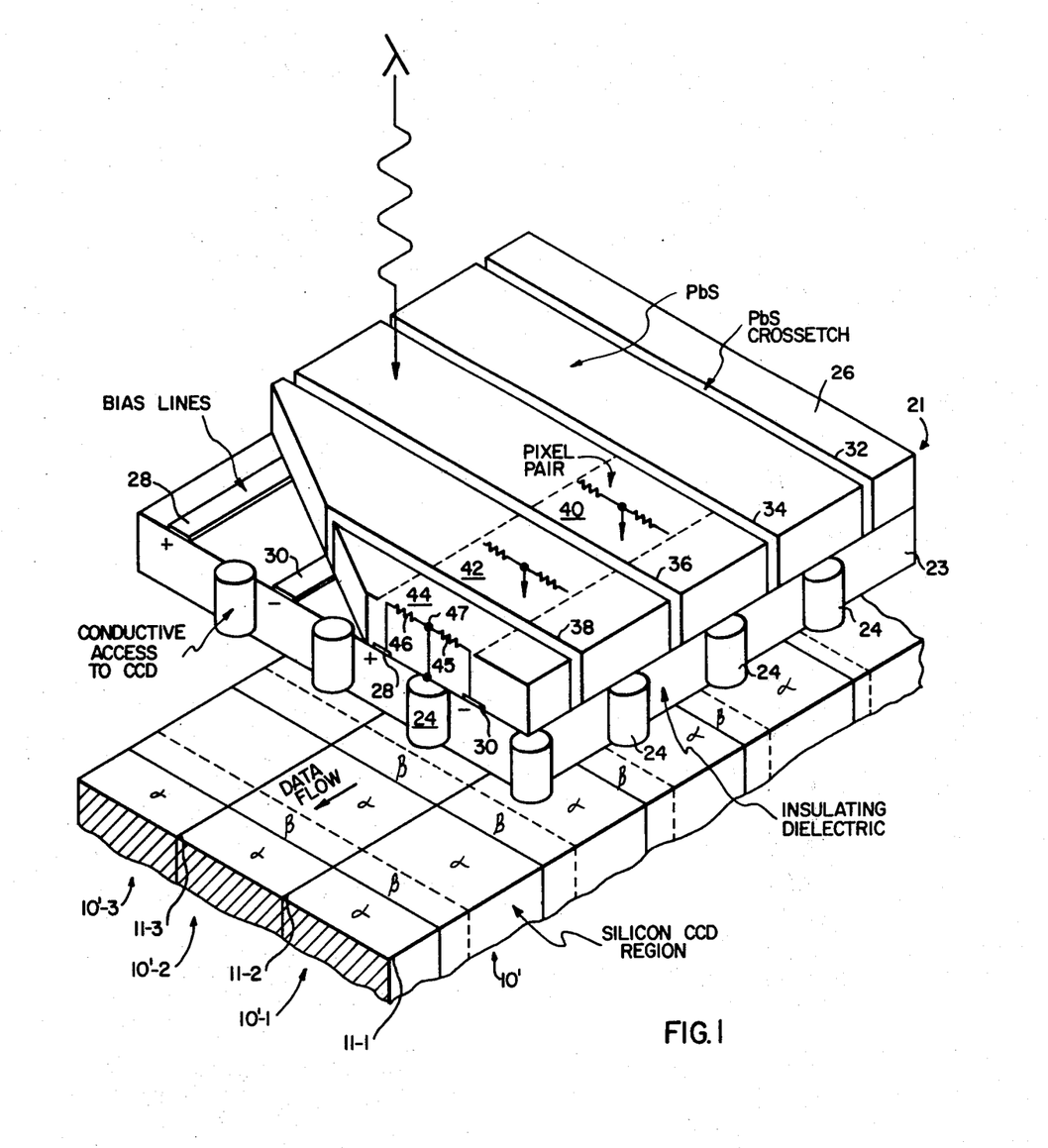
FIG. 1 is a schematic, perspecitve illustration of a sensor array and associated CCD channels as may be afforded in a monolithic structure for an MTI system in accordance with the invention.

In FIG. 1 is shown an illustration of a suitable monolithic sensor array and CCD structure for use in accordance with the system of the present invention. The elements of FIG. 1 are shown in a greatly enlarged and exploded arrangement to facilitate description. Moreover, whereas an infra red optical sensor is suggested in this particular application, it should be appreciated that any type of array device (e.g. acoustical) generating electrical signals which can be coupled into a CCD may be employed in the alternative.

The CCD structure 10' is shown as including three CCD analog shift registers 10'-1, 10'-2 and 10'-3, each composed of a plurality of pairs of stages, each pair including stages designated $\alpha$ and $\beta$. To further emphasize the paired relations, the delineation between the stages $\alpha$ and $\beta$ of a given pair is indicated by a dotted line whereas the successive pairs are delineated by solid lines. It, of course, will be understood that a large number, as desired, of such pairs and such shift registers are employed in a practical system. Moreover, the CCD shift registers and the paired stages thereof are developed in a suitable semiconductor material, such as silicon, with the above-referenced delineations between the plurality of shift registers and the stages of each formed by suitable "channel stop" regions and the associated clock electrode structure, respectively. Particularly, successive ones of the parallel shift register are defined at the lateral boundaries thereof by what are termed channel stops comprising suitable barrier-type doped (by implant or diffusion) regions or "high threshold" channel dielectric regions and positioned along the lines 11-1, 11-2, 11-3, etc.

The sensor array and interconnect structure generally designated at 21 is formed by suitable deposition and masking steps onto a surface of the CCD structure 10. The composite structure 21 includes an insulating layer 23, for example silicon dioxide, which, though exploded from the CCD 10' in FIG. 1, would be deposited on the surface thereof. Suitable openings then are formed in the layer 23 to provide conductive interconnects shown as cylindrical elements 24 which provide conductive access to the CCD structure.

The sensor of FIG. 1 may be an infrared sensor and thus the layer 26 may comprise lead sulfide. First, bias lines 28 and 30 are deposited on the insulator layer 23 and may be connected respectively to positive and negative sources of bias potential. A lead sulfide layer 26 then is deposited over the bias lines 28 and 30 onto the surface of insulating dielectric layer 23 and thereafter cross-etched as shown at 32, 34, 36 and 38. The cross-etching in conjunction with the pairs of bias lines 28 and 30 define in the layer 26 a matrix of individual photosensor elements, a few of which are illustrated at 40, 42 and 44.

Each of the elements 40, 42 and 44 carries a schematic illustration of a sensor electrical circuit extending between the bias lines 28 and 30 and including two series connected resistive elements with the junction thereof making electrical contact to the interconnect elements 24. Such a sensor arrangement is termed a "pixel pair" and would be employed where the incident radiation to be detected is of "point size" and thus selectively may irradiate either of the sensor portions of the pair shown respectively at 45 and 46 for the element 44. A differential output thus is obtained from the series junction 47 depending upon which of the elements 45 and 46 is irradiated. The resulting signal then is supplied through the interconnect 47 to the $\alpha$ stage of a corresponding pair of stages ($\alpha$ and $\beta$) of the CCD analog shift register. By suitable operation of the shift register, to be described, the input signals are shifted through successive ones of the pairs of stages and, within each pair, from the $\alpha$ stage to the $\beta$ stage, in a manner to be described. The direction of data flow thus is indicated by the arrows shown in relation to the shift registers 10'-1 and 10'-2.

Figure 2:
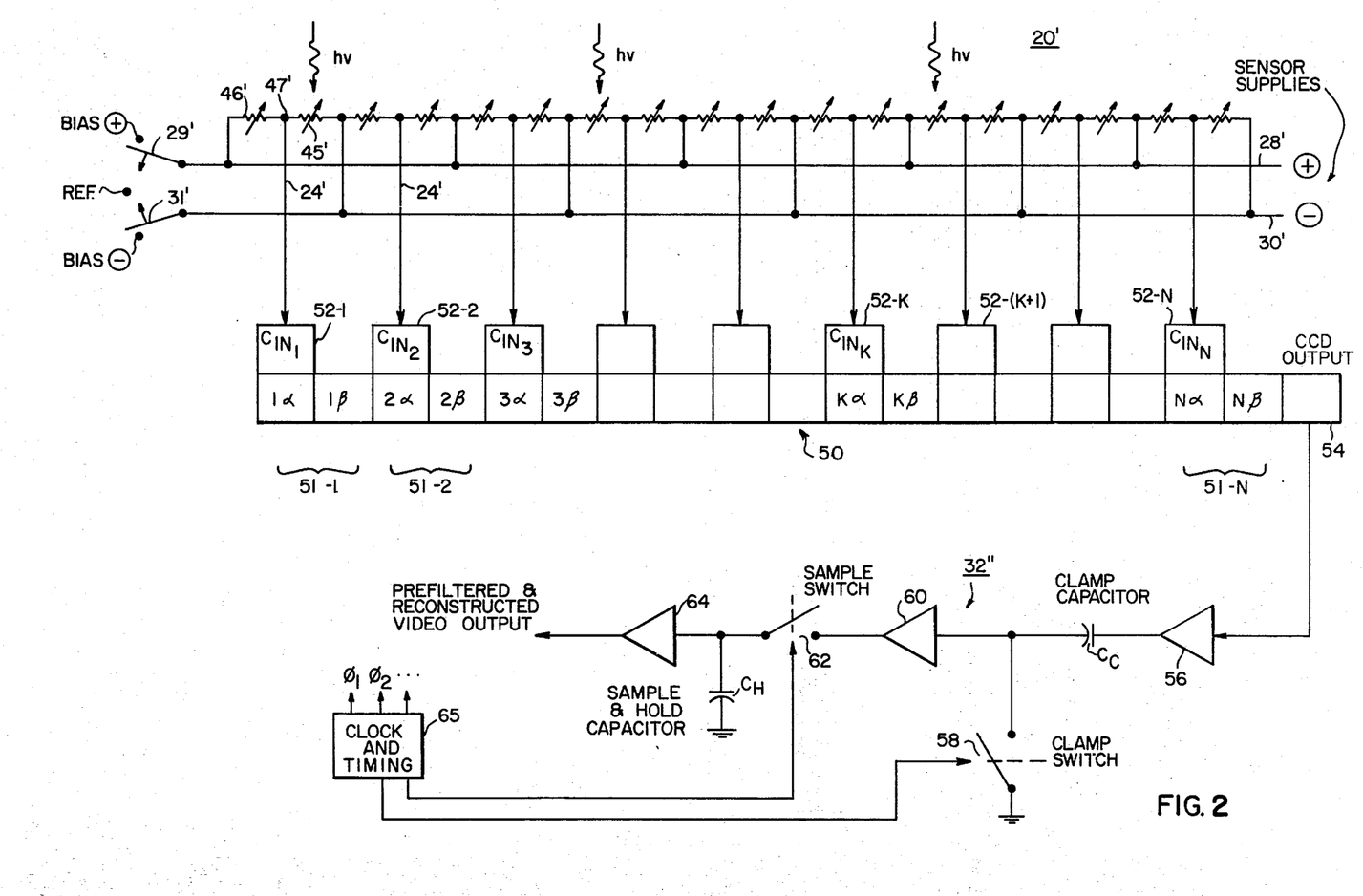
FIG. 2 is a schematic view of one CCD channel and an associated line of sensors of the array for explaining operation of the structure of FIG. 1.

FIG. 2 is a schematic illustration of one of the CCD analog shift registers of FIG. 1 and the associated sensor line of the sensor array 20, along with certain input and output charge signal circuitry. Particularly, the shift register 50 may correspond to any one of the shift registers 10'-1, 10'-2, . . . of FIG. 1 and includes a plurality of N stages 50-1, 50-2 . . . 50-N each including a pair of stages $\alpha$ and $\beta$ -- e.g., stage 50-1 includes a pair of stages 1$\alpha$ and 1$\beta$.

Using identical, but primed numerals to identify elements of FIG. 2 corresponding to those of FIG. 1, the single line of the sensor array 20° shown in FIG. 2 includes a sensor associated with each of the $\alpha$ stages of each of the pairs of stages of shift register 50. Since all are identical, illustration is provided only of the sensor input to stage 51-1 which illustration includes the pixel pair sensors 46' and 45', the effective series junction 47' which is connected through connector 24' to the first pair 51-1 of shift register stages and, more specifically, through a stabilized charge injector circuit 52-1 labeled $C_{IN_1}$. In like manner, each $\alpha$ stage of the successive pairs 51-2, . . . 51-N includes a stabilized charge injector circuit 52-2, . . . 52-N. The positive and negative bias lines 28' and 30' are shown as supplying energization to the sensors in parallel fashion as provided in FIG. 1.

The N $\beta$ stage of the last shift register stage pair 50-N supplies its output to the CCD output circuit 54 which produces first and second output sample voltage. The remaining components of FIG. 2 include an amplifier 56, a clamp capacitor $C_c$, a clamp switch diagrammatically illustrated at 58 and which may comprise a suitable transistor switch, a further amplifier 60, sampling switch 62 which again may comprise a suitably controlled transistor switch, sample and hold capacitor $C_H$, and an output amplifier 64 from which the reconstructed video output of the sensor is derived.

Figure 3:
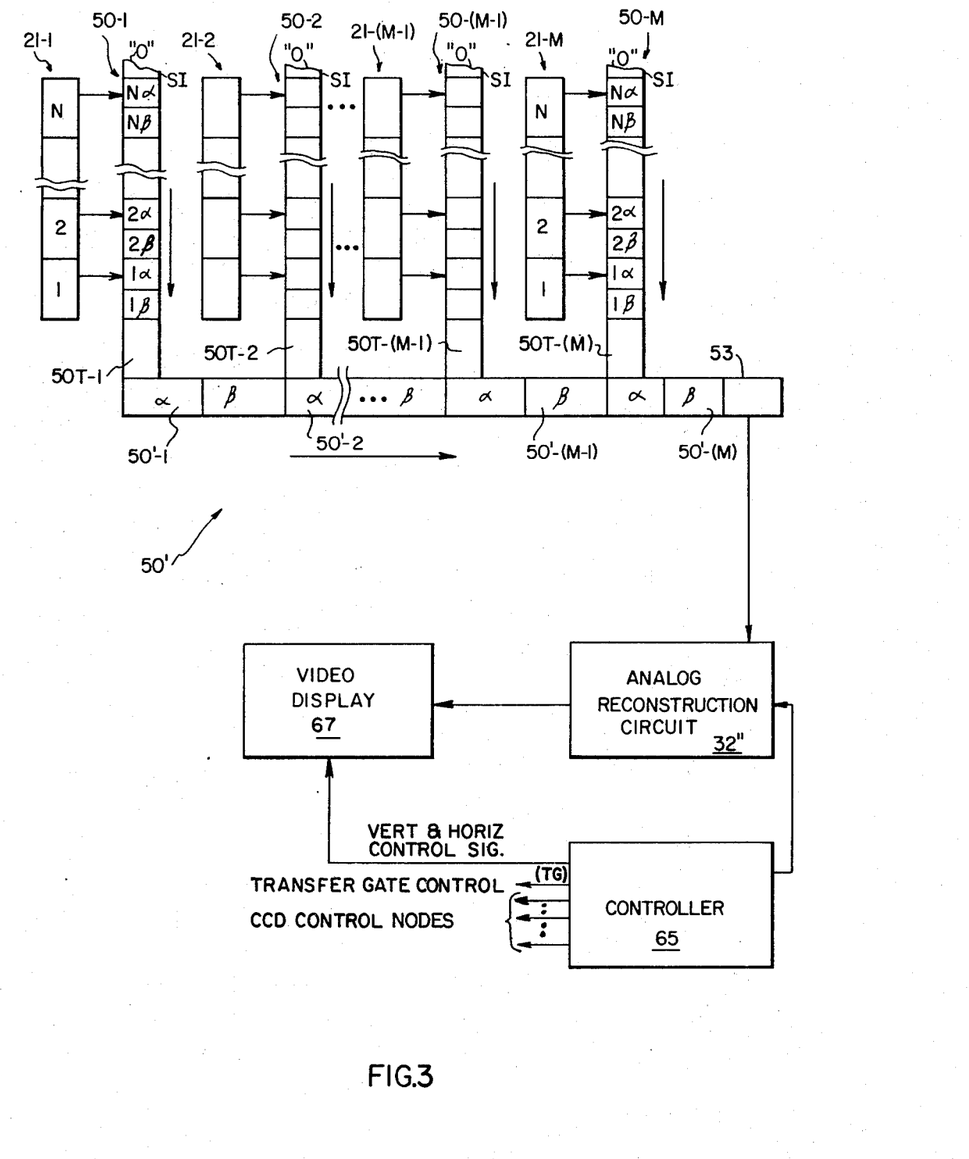
FIG. 3 is a schematic block diagram illustration of CCD processing of the two-dimensional sensor array outputs in accordance with FIG. 2.

FIG. 3 is a schematic, partly in block diagram form, of a two-dimensional sensor as shown in FIG. 1 with associated CCD shift registers. M lines (columns) of sensors, shown at 21-1 to 21-M, each contain N sensors, each sensor providing its output to the corresponding α stages of a plurality of CCD shift registers 50-1 through 50-M. The CCD circuits 50T-1 through 50T-(M) correspond to the CCD output sensor circuit 54 shown in FIG. 2 and each comprise a transfer gate for transferring a charge from the 1β stage of each of the shift registers 50-1 through 50-M into the α stage of the respectively associated stage pairs 50'-1 through 50' (M) of the output shift register 50'. The output sensor circuit 53 which produces first and second output sample voltages of the register 50' is supplied through an analog reconstruction circuit 32" to the video display 67. Controller 65 controls the functions of circuits 32" and 67, as well as the shift registers by suitable timed outputs therefrom in a manner to be described.

In the operation of the circuit of FIG. 3, the signal outputs of the sensor array corresponding to the picture elements of the first snapshot are stored in the stages β, and the corresponding picture element signal outputs for the second snapshot then are stored in the stages α.

The shift registers 50-1 through 50-M then are read out in the direction indicated. Accordingly, the first pair of corresponding picture element samples (1α and 1β from each of the CCD shift registers) are transferred in succession into the shift register 50' to occupy the corresponding pair of α and β stages thereof, maintaining the same paired relationship. Controller 65 causes the CCD line (column) shift registers 50-1 to 50-M to be read out at a desired rate and timing, such that the M-pairs of 1α and 1β outputs are transferred substantially simultaneously, in sequence, into the corresponding stage pairs of the output CCD (row) shift register 50'. Register 50' then is read out at a rate corresponding to the horizontal line scan of the video display 67, the latter also controlled by timing controls from the controller 65. The differenced output for each α/β pair from circuit 32" then provides the signal data necessary for the control (e.g., intensity modulation) of the video display scan in corresponding positions of the horizontal line scan. When the first horizontal line scan is completed, the 2α, 2β pairs, already advanced to the 1α, 1β shift register stages of registers 50-1 to 50-M, are transferred into the corresponding α,β stage pairs of the output shift register 50'. Register 50' again is read out and then processed during the next horizontal line scan of the video display 67.

The α, β pairs read out from the register 50' are processed by the analog reconstruction circuit 32". (See FIG. 2). Controller 65 closes clamping switch 58 to store the value of the β signal on the clamping capacitor $C_c$ and then opens switch 58; controller 65 then closes sample switch 62. The corresponding α signal of the pair then is processed through amplifier 56 and capacitor $C_a$, yielding the difference between the α and β signals to amplifier 60 to establish a corresponding voltage level on the holding (storage) capacitor $C_H$. The resultant signal level on capacitor 37 accordingly contains imaging information for display, only when the α and β signals differ, resulting from movement of the target in the scene. The voltage value held on capacitor $C_H$ then is supplied through amplifier 64 to the video display 67 to modulate the intensity of the scanning beam.

The operation of the circuit 32" may be expressed as follows. Where $Q_K(\beta)$ is the first picture element value stored on the clamp capacitor $C_c$ by operation of clamp switch 58, and where $Q_K(\alpha)$ is the corresponding time-displaced, corresponding picture element signal sample of the pair:

$$Q_K^{(\alpha)} - Q_K^{(\beta)} = F_K(T + \Delta T) - F_K(t) \cdot C_{IN_K} = Y_K(t) \quad (1)$$

where $\Delta T$ is the time difference of the Ktha and β pair and $Y_K(t)$ is the output therefor. As is apparent from Equation (1), since both signal samples α and β follow the same path through the associated CCD line shift register and the output shift register 50', threshold voltage non-uniformities cancel exactly in the differencing operation. However, since the β samples are stored for a slightly longer interval than the α samples in accordance with the described sampling operation, residence time of the α,β samples is not equal and hence, to some limited extent, the α,β samples do not experience the same effects of leakage current. A reasonably similar residence time, however, does exist such that to a large extent, the differencing process does serve to remove a majority of the errors arising out of non-uniformity of the leakage current to which the signal samples are subjected while propagating through the various CCD shift registers.

Each line shift register 50-1 to 50-M moreover includes a serial charge injector SI for injecting a "fat zero" into the first stages Nα. This provides a specific signal level in the stages from which the α,β signals are advanced during read-out, and which correspondingly would otherwise not be storing any signal level — i.e., the potential wells would be empty, nominally. If the wells were permitted to be empty (i.e., rather than storing a "fat zero"), traps in the CCD channel will "trap" signal charges and hold them, contributing signal dispersion and thus reduced resoluion/MTF (modulation transfer function).

From the foregoing, it will be appreciated that FIG. 2 has illustrated the reconstruction circuit 32" as associated with a shift register 50 corresponding to one of the registers 10 into which the sensor outputs are injected. This merely is to facilitate appreciation of the paired α, β storage technique as relates to the differencing operation of circuit 32". In fact, register 50 of FIG. 2 corresponds more directly to register 50' of FIG. 3, which provides its output to the circuit 32".

It is also significant to note that the outputs of registers 50-1 to 50-M are supplied by direct charge transfer (i.e., not through signal injection techniques, as required to inject the sensor outputs) to the α stages 50'-1 to 50'-M of the multiplexing register 50' of FIG. 3, since internally the packets are merely continuing propagation down a CCD shift register channel. The transfer gates 50T-1 to 50T-M, however, provide a buffering function to permit the control of the timing of transfer by controlling 65, consistent with the above discussion.

Preferably, the entire structure of the sensor array and shift registers of FIG. 1 and including the circuits of FIGS. 2 and 3 as well is provided in a monolithic semiconductor structure. The system of the invention provides a unique and highly effective, yet simple, capability of performing on-chip cancellation of the steady background signals or frame-to-frame subtraction in producing the final output, as well as reduction of errors arising from CCD threshold and leakage non-uniformities, as previously noted.

PARALLEL SIGNAL INJECTION

As above noted the injection of the sensor signals to the CCD column shift registers is preformed in a parallel input mode (PI) with serial readout (SO). Parallel injection must be low in noise if satisfactory signal levels are to be realized. The following explains how such a requirement may be satisfied in a CCD system.

A significant source of noise in charge injection arises from the uncertainty associated with the input capacitance $C_{IN}$ and particularly input capacitance non-uniformities $\Delta C_{IN}$. Since input capacitance non-uniformities ($\Delta C_{IN}$) arise from closely limited geometric fluctuations across the CCD, it follows that a large value of $C_{IN}$ reduces the relative non-uniformities caused thereby, during injection:

$$\Delta C_{IN}/C_{IN_k} <<< 1.$$

Figure 4:
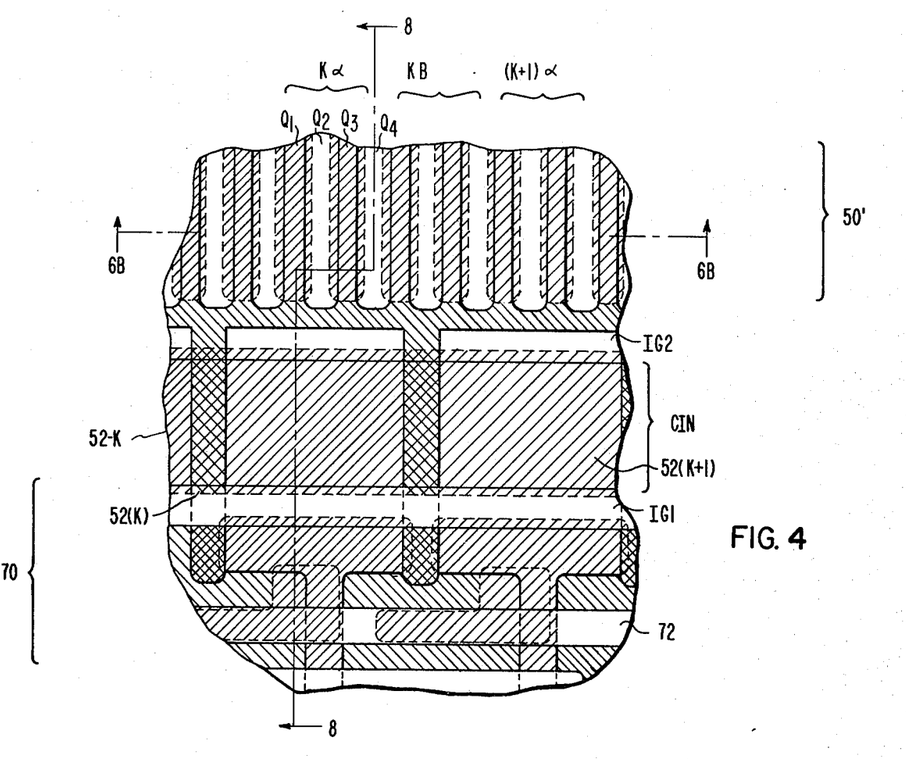
FIG. 4 is a plan view of a CCD shift channel and associated parallel SCI structure.

FIG. 4 is a plan view of a portion of a CCD monolithic structure including a CCD shift register 50' (similar to the shift register shown at 50' in FIG. 3) including a CCD channel having stages $K\alpha$, $K\beta$, $(K+1)\alpha$, . . . . The individual gate electrodes arranged for four-phase clocking are illustrated at $\phi_1$ through $\phi_4$ and are included at each of the successive stages. The portion 70 comprises plural stabilized charge injectors for parallel signal charge injection into the CCD shift register 50' (in lieu of the simpler transfer gate, 50T, in FIG. 3).

The input gate 52(K) of stage (K) having the effective capacitance $C_{IN(K)}$ is seen in FIG. 4 to comprise a relatively large gate electrode 52(K). The gate 52(K+1) as well is seen corresponding to the next stage (K+1). Channel stop 53 separates and thereby isolates the adjacent gate electrodes, and hence the capacitances, to avoid any interaction therebetween. Channel stop 53 also extends in a "T" type configuration as seen in the drawing to include a portion extending from left to right above the conductor IG2. Gate conductor IG1 is also seen in the drawing. The areas V(K)+ and V(K+1)+ are the signal input gates and may be visualized as corresponding to the arrows at the inputs to the input capacitors 52-(K) and 52-(K+1) in FIG. 2. Regions labeled PDIN(K) and PDIN(K+1) are the input diffusions, to be discussed. Element 72 is an aluminum stripe which extends across the areas PDIN and electrically ties them together.

Figure 5:
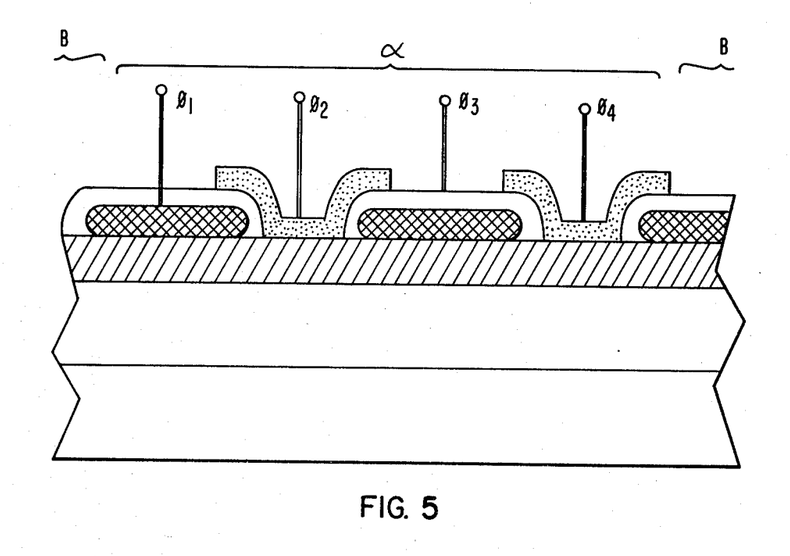
FIG. 5 is a cross section taken along the line 5—5 of FIG. 4 and showing components of the CCD shift channel.

FIG. 5 illustrates a cross-sectional view taken along the line 5-5 in FIG. 4 to permit the reader to more readily visualize the arrangement of the successive electrodes $\phi_1$ to $\phi_4$ of the successive pairs of stages $\alpha$, $\beta$ as exist in the CCD shift register 50'.

Figure 6A:
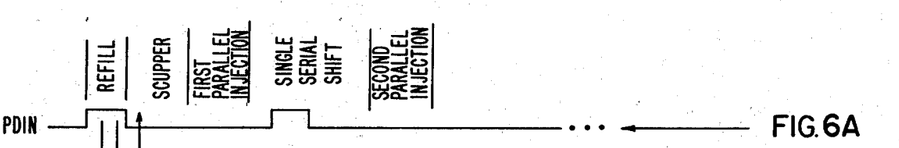
FIGS. 6A through 6H comprise operating waveforms for the SCI and CCD shift register channel of FIGS. 4 and 5 for explaining MTI operation with parallel charge injection.
Figure 6B:
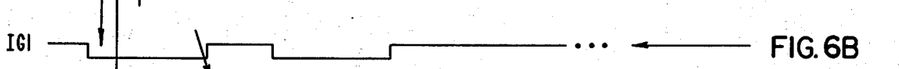
Figure 6C:
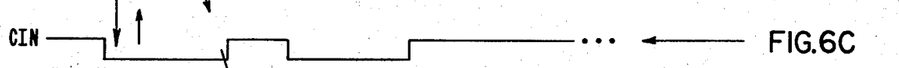
Figure 6D:
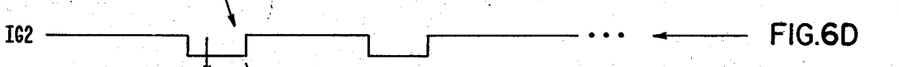
Figure 6E:
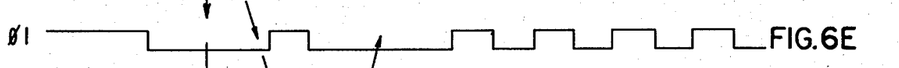
Figure 6F:
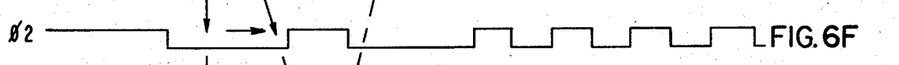
Figure 6G:
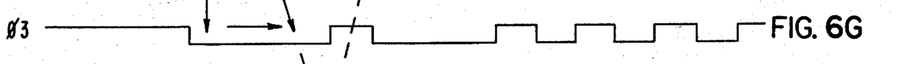
Figure 6H:
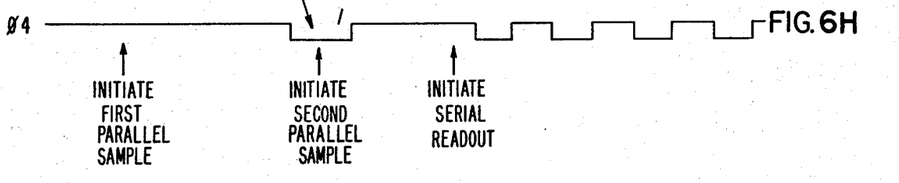
Figure 7:
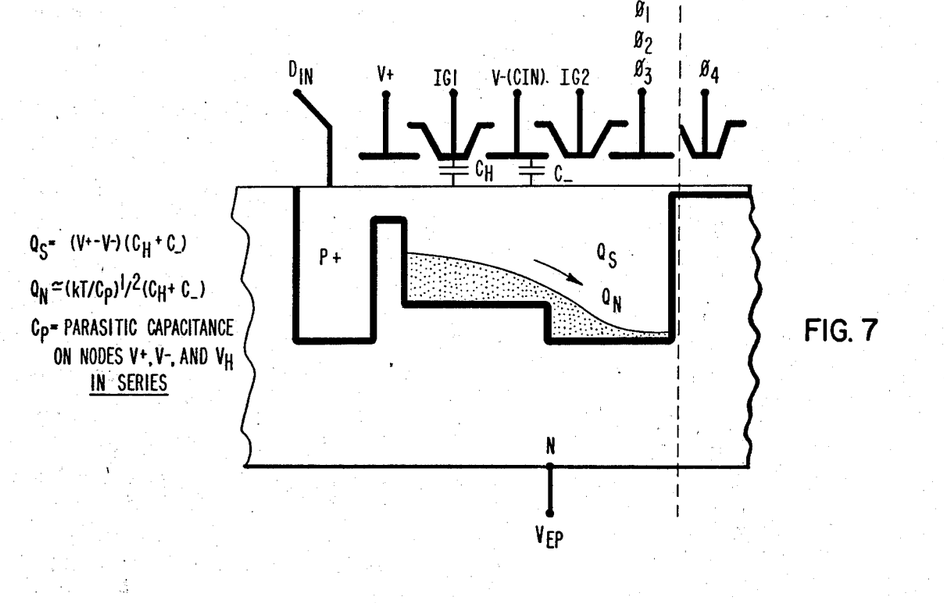
FIG. 7 is a schematic view through a cross section of an SCI for indicating the relationship of electrodes and the waveforms of FIGS. 6A through 6D and resulting potential well conditions.
Figure 8:
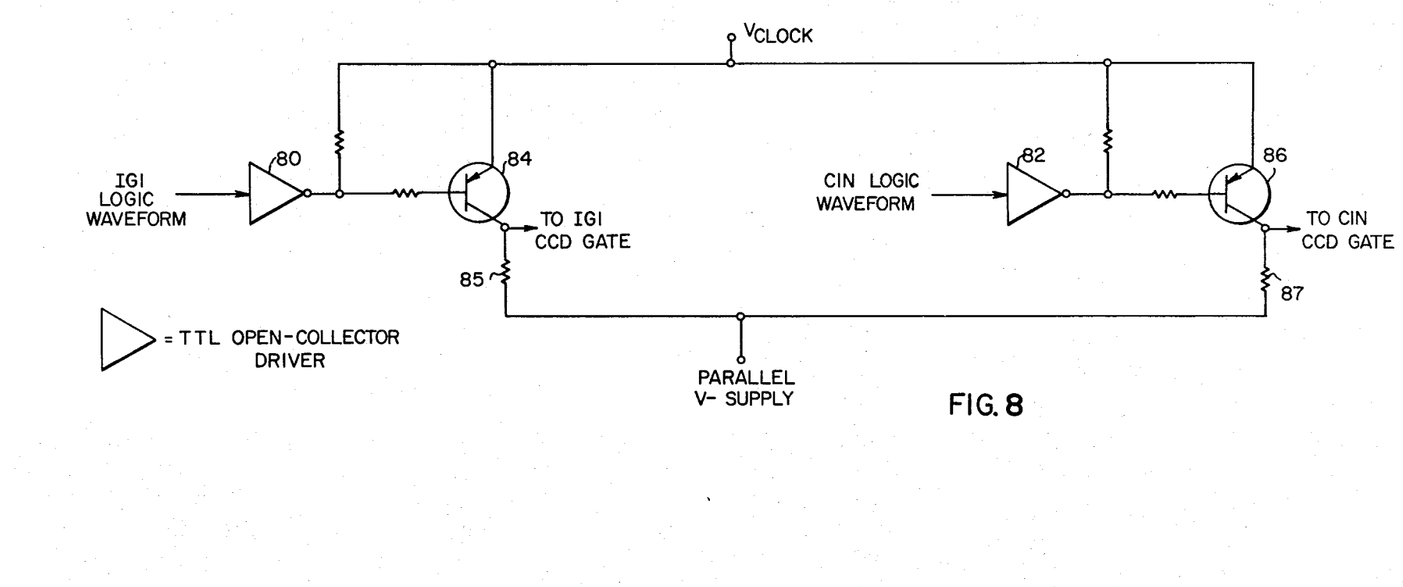
FIG. 8 is a schematic of a circuit for generating the waveforms of FIGS. 6B and 6C.

The injection operation and the shift operation of the structure of FIGS. 4 and 5 will be more readily appreciated with reference to the waveforms of FIGS. 6A through 6H, the schematic cross-sectional illustration of FIG. 7, the latter indicating in essence a cross-sectional view along the line 11-11 in FIG. 4, and a driving circuit the schematic of which is shown in FIG. 8.

In FIG. 4, the regions PDIN correspond to the region P+ with the input $D_{IN}$ in FIG. 7, the region P+ acting as a source of minority carriers during the refill operation as seen in FIG. 7 and subsequently as a drain during the scupper period. The signal input is V+ in FIG. 7 and is correspondingly labeled for the stages (K) and (K+1) in FIG. 4.

For a reason to be explained, the capacitances CIN are of relatively large area, for example 70 microns in width and 56 microns in length, as those relative dimensions are illustrated in FIG. 4. While this affords an improvement in noise reduction during charge injection, it creates a problem as to achieving adequate speed of propagation of the injected charges from under these large area capacitances into the CCD shift register. In that regard, from FIG. 4 it is to be appreciated that the charge propagates from the capacitor, for example, for the stake (K) into the gate electrodes $\phi_1$, $\phi_2$ and $\phi_3$ of the (K$\alpha$) stage. As will be seen, gate electrode $\phi_4$ creates a barrier during the injection of the charge into this region of the shift register stage.

To achieve adequate speed of propagation of the charges from under the input gate capacitances, successive gates IG1 and V- are provided which effectively electrically separate the length of the gate capacitances to permit successive pushing of the charge packet from under each such capacitance into the respective receiving stage of the shift register.

With reference to FIGS. 6B and 6C, it will be seen that the signals IG1 and CIN become attractive in succession during the refill to attract charges from the P+ diffusion into the input capacitance. This flow of the charges would be into the area, or region, underlying the gates IG1 and V- in FIG. 7. Excess charges are scuppered out from this region down to the level of the signal V+ and thus back into the P+ region which now acts as a drain.

Parallel charge injection occurs for the two successive samples for MTI operation, and the time-spaced interval during which it occurs is shown in relation to FIG. 6A through FIG. 6H. The time displacement of the two sampling and corresponding injection operations may be selected as desired. As shown in FIGS. 6A to 6H, the second sampling initiates after PDIN for the second injection is completed. The duration of IG1 through $\phi_4$ for the first sample may be increased or decreased to alter correspondingly the time displacement. If a very long time displacement is necessary, in view of leakage non-uniformities for the $\alpha$ and $\beta$ packets, however, alteration of the clocking controls may be required. For convenience, the letter descriptions in the following refer both to the waveforms of FIGS. 6A to 6H and the gate structure of FIG. 7. IG1 goes high and therefore repulsive, pushing charges into the neighborhood of CIN. IG2 has become attractive, as have $\phi_1$, $\phi_2$, $\phi_3$. In succession, CIN and IG2 become repulsive, injecting the charges into the stage, then blocking off the parallel structure to permit a serial shift of the charge packets.

At the time of the first parallel injection, $\phi_4$ is repulsive and creates a barrier; $\phi_1$, $\phi_2$ an $\phi_3$ are attractive and therefore the injection is achieved.

Again referring to FIGS. 6A through 6H, during the interval labeled "single serial shift", the injected charge is moved forward from the $\alpha$ stage to the $\beta$ stage. Specifically, $\phi_1$, $\phi_2$ an $\phi_3$ successively become repulsive, and $\phi_4$ now is attractive, causing the charge to advance to the last portion of the $\alpha$ stage, i.e., that under the $\phi_4$ electrode. $\phi_1$ becoming attractive followed by $\phi_4$ becoming repulsive then corresponds to the charge packet moving into the $\beta$ stage of the $\alpha/\beta$ pair. At this juncture, PDIN having occurred, the second parallel sampling may be initiated, followed by the second parallel injection into the $\alpha$ stage (i.e., repeating the preceding steps).

As before noted, there is a difficulty with a large input capacitance of assuring adequate speed of propagation of the charges. This is overcome in accordance with the effective electrical dividing of the capacitance by the special electrical pulsing technique relating to the signal waveforms IG1 and CIN. In essence, it is desired that the electrodes create a common potential well while the charge is being initially set up in the underlying region, but then provide two successive pushes of the charges from that region during the charge injection operation.

This is accomplished in accordance with the circuit of FIG. 8. The IG1 and CIN logic waveforms are applied to TTL open collector drivers 80 and 82, respectively, the outputs thereof driving PNP transistors 84 and 86, respectively. The transistors 84 and 86 are connected at their emitters to a clock source and at their collectors to a parallel V− supply through resistors 85 and 87, respectively. During the charge onto the common regions of IG1 and CIN, transistors 84 and 86 are effectively turned off by the corresponding logic waveforms applied thereto and, as a result, the outputs from their collectors through the respective resistors 85 and 87 and tied to the parallel V− supply, creating a common potential condition under these gates.

When IG1 goes high, (FIG. 6B), transistor 84 becomes conductive and hence its output at its collector terminal raises to the level of the clock, the clock presents a high repulsive level, producing the first push function. Subsequently, CIN goes high, turning on transistor 86 and raising its collector output across resistor 87 to the high repulsive level of the clock and providing the further push function.

In conclusion, the foregoing has disclosed a CCD (CTD) implementation of an MTI sensor, affording a greatly simplified yet highly effective operation which may be performed on-chip in a monolithic structure. Low noise injection techniques and full correction of errors due to threshold variations are provided, as well as reduced compensation for leakage non-uniformities through ECDS techniques as afforded by the MTI signal processing functions herein. Numerous other applications and adaptations and modifications of the system of the invention will be apparent to those of ordinary skill in the art, and thus it is intended to encompass all such modifications and adaptations of the invention within the true spirit and scope of the appended claims.

What is claimed is:

1. A focal plane processor for moving target imaging for detecting a moving target in a scene having fixed background information, comprising:

a sensor array comprising plural rows and columns of sensor elements, charge transfer devices comprising a plurality of pairs of stages respectively corresponding to said plurality of sensor elements and arranged in corresponding rows and columns with the columns thereof each arranged as a shift register for propagation of charges through the successive stages of the successive pairs, a plurality of charge injectors respectively corresponding to said sensor elements and said pairs of stages, each operable for injecting a charge packet into the first stage in a first time interval and for injecting a second charge into said first stage in a second time interval while said first charge packet is advanced to said second stage, control means for generating clocking voltages for effecting propagation of charges through said columns of shift register stages at a predetermined shift cycle rate, and generating control signals for controlling the sampling of the output signals of said sensor elements at desired first and second time intervals to effect injection of the said first and second, pair-related charge packets corresponding to first and second time-related samples of the respectively associated sensor element output signals into said successive stages of each pair corresponding to each said sensor element, and said control means generating said clocking signals to advance said pair-related first and second charge packets corresponding to each said sensor element to a final stage of each of said columns of shift registers, and a further charge transfer device shift register having a plurality of pairs of stages respectively corresponding to said columns of shift registers, each pair receiving in the first stage thereof an output charge packet from the final stage of the corresponding column shift register and said control means controlling said further charge transfer device shift register to receive said pair-related first and second charge packets in row-by-row succession for all said row-related pairs of all said columns, and for shifting said pairs of first and second charge packets of each said row through said succession stages of said further shift register to the final stage thereof, and means responsive in succession to said first and second time-related charge packets of each of said successive pairs as shifted to said final stage to produce corresponding first and second output sample voltages, and analog circuit means responsive to the first and second output samples corresponding to the first and second charge packets of each said related pair of each said successive row to store said first sample and to compare said second time-related sample of the pair therewith and determine the difference therebetween, and to supply said difference as the output signal from said array.

2. A processor as recited in claim 1 wherein there is provided means for displaying any moving target in the scene to which the sensor array is exposed, including means for scanning a plurality of successive, displaced rows of said display means in synchronism with the rate of propagation of successive rows of said related pairs of first and second charge packets through said further shift register, and means receiving the output signal of said array for modulating the intensity of said display.

3. A processor as recited in claim 1 wherein each said stabilized charge injector includes a diffusion acting alternately as a source and drain of carriers of a charge packet to be injected, and, in succession, a first electrode, a first gate electrode, a second electrode of substantial area forming a large capacitance and a second gate electrode and a third gate electrode, and said control means selectively renders said electrodes attractive and repulsive to the carriers to be injected, in response to said control means, said diffusion operates as a source of carriers and said first gate and second electrode are rendered attractive in succession to refill the potential well defined by said first gate and said second electrode with said charge carriers and said diffusion then operates as a drain to remove excess carriers in a scupper operation, said gate electrode remaining repulsive and in sequence, said second gate electrode is rendered attractive and said first electrode, said second electrode, and said third gate electrode then are rendered repulsive for injecting charges into said associated stage of said charge transfer device.

4. A processor as recited in claim 1 wherein: each said stabilized charge injector includes a diffusion acting alternately as a source and drain of carriers of a charge packet to be injected said plurality of stabilized charge injectors are disposed in side-by-side relationship on a common substrate with said charge transfer device for effecting parallel injection of charges into respectively associated stages of said charge transfer device, means are deposited on said substrate to electrically isolate adjacent said parallel charge injectors, each said stage of said charge transfer device includes a group of plural electrodes of the same number per group and operable under control of clocking potentials from said control means to propagate a charge through each said stage and through successive stages of said charge transfer device, and said control means selectively renders said electrodes attractive and repulsive to the carriers to be injected, in response to said control means, said diffusion operates as a source of carriers and said first gate and second electrode are rendered attractive in succession to refill the potential well defined by said first gate and said second electrode with said charge carriers and said diffusion then operates as a drain to remove excess carriers in a scupper operation, said gate electrode remaining repulsive and in sequence, said second gate electrode is rendered attractive and said first electrode, said second electrode, and said third gate electrode then are rendered repulsive for injecting charges into said associated stage of said charge transfer device.

5. A focal plane processor for moving target imaging for detecting the presence of a moving target in a fixed scene, comprising:

a two-dimensional sensor array including a plurality of column sensor elements, each column including plural sensor elements with the corresponding sensor elements of the plurality of columns defining corresponding rows, said sensor being exposed to said scene and each sensor element being responsive to an elemental portion of said scene and producing an output responsive to the information content of said elemental portion of said scene, plural columns of charge transfer devices corresponding to said columns of sensor elements and each column including a plurality of successive stages related as pairs, each said pair being associated with a respectively corresponding one of said sensor elements, control means for propagating charge packets through successive stages of each said column charge transfer device, in synchronism for all said columns thereof, at a predetermined shift cycle rate establishing a predetermined time duration between propagation of said charge packets through successive said stages of the corresponding column charge transfer devices, a plurality of charge injectors respectively associated with said plural pairs of stages, each charge injector receiving a sample of the sensor signal output from the respectively associated sensor and injecting a corresponding charge packet into said first stage of the respectively associated pair of stages, at first and second, displaced times, the rate thereof independent of said shift cycle rate, said control means generating control signals for selectively controlling the injection of corresponding charge packets by said plurality of injection means into the respectively corresponding first stages of said associated pairs of stages of said corresponding columns of charge transfer devices, in accordance with desired, time-displaced intervals of said sampling of the outputs of said sensor elements, said control means being selectively operable to initiate said first sampling and controlling said charge injectors and the associated first stages of said pairs of stages of said charge transfer devices, to inject and maintain charges corresponding to said sensor elemental signals at said first time interval and for selectively enabling the initiation of said second sampling and, in timed relation thereto, completing a shift of the charge packet in said first stage of the related stages of each said pair to said second stage while enabling the injection of a successive charge packet corresponding to the sensor element sample at said second time interval into said first stage, and thereafter clocking said column transfer devices to propagate said charge packets corresponding to each said first and second time-displaced sensor signals through said successive stages of said column shift registers at said predetermined shift cycle rate, simultaneously for all of said stages of all of said columns of charge transfer devices, thereby maintaining said first and second charge packets corresponding to said first and second time-displaced sensor element signal samples in paired relationship for propagation to an output stage of each of said columnar charge transfer devices, and a further charge transfer device having a plurality of successive stages related as pairs, each said pair respectively corresponding to one of said column charge transfer devices for receiving into the first stage of each said pair, a charge packet injection corresponding to the charge packet propagating through the output stage of the respectively corresponding column charge transfer device, and said control means controlling said further charge transfer device to receive said successive charge packets of a related pair from the output stages of said column charge transfer devices in time sequence at a predetermined shift cycle rate, and then controlling said further charge transfer device to propagate all said pair related charge packets therein to an output stage of said further charge transfer device prior to receiving further charge packets propagating from said output stages of said column charge transfer devices and comprising a first of a related, successive pair of said charge packets, and means for sampling, from an output stage of said further charge transfer device, first and second output signal samples corresponding to said first and second pair-related charge packets at said cyclic shift rate of said further charge transfer device, and, for each said related pair, storing a value corresponding to said first time output sample for comparing with the value of said second time output sample and determining the difference therebetween, said difference signals thereby representing the presence of a moving scene.

6. A processor as recited in claim 5 wherein said charge transfer device each include a plurality of electrodes for each stage and each said charge injector includes a diffusion and gates, said control means controlling the potential condition of said diffusion and said gates to initiate said first injection corresponding to said first time-displaced sensor signal sample and controlling said gates and said electrodes of the first stage of the associated pair of stages for each said injector to receive and store the charge packet corresponding to said first sensor signal sample in said associated stage, and enabling said second time interval sampling to initiate said second time-interval injection while initiating a single serial shift of said first charge packet to said pair-related second stage and thereafter initiating serial readout of each of said first and second charge packets through said successive stages of each of said column charge transfer devices.

7. A processor for moving target imaging of a sensed scene comprising at least one elemental area, and including:

a charge transfer device including at least two stages, a first of said stages having an injector;

sensor means connected to said injector corresponding to said at least one elemental area for producing an output signal in proportion to the information content of said elemental area of the sensed scene, a change of information content in said elemental area indicating movement in the sensed scene, control means for selectively producing clocking signals to advance charge packets through said at least two pair-related stages in succession and for supplying control signals to said injector to enable injection of a charge packet into the the first of said related pair of stages, said control means being selectively rendered operable to initiate said first sampling of said sensor output by enabling said injector to develop a charge packet corresponding to the level of that said first sample of said sensor output, said control means producing control signals for said injector and a first sequence of clocking signals for said first of said pair-related stages to enable the injection of said first charge packet by said injector means into said first associated stage, and said control means being selectively operable to generate a second sequence of said control signals upon initiating a second sampling of said sensor output to cause said injector to inject a corresponding second charge packet into said associated first stage while propagating said first charge packet to said second stage of said associated pair, and thereafter to generate said clocking signals at a predetermined shift cycle rate to propagate said first and second charge packets through said successive stages.

8. A processor as recited in claim 7 wherein there are provided at least plural said pairs of related first and second stages and plural sensor elements respectively associated with each of said pairs of stages, said control means simultaneously controlling said plurality of injectors and stages in accordance with said first and second samplings and first and second parallel injections, said single serial shift and said serial readout of said successive stages.

9. A processor as recited in claim 8 wherein there are provided at least plural columns of sensor elements and pairs of shift stages and associated injectors, said control means simultaneously controlling all of said plurality thereof.

10. A system as recited in claim 9 wherein there is further provided:

a means for displaying said imaged moving target, including means for scanning successive rows of said display means at a rate corresponding to the rate of transfer of all of said charge packets through said further charge transfer device, and means responsive to said output signal from said analog circuit means for controlling the intensity of said display in proportion thereto.

* * * * *